United States Patent [19]

Hess, Jr.

[11] 3,789,241

[45] Jan. 29, 1974

[54] ELECTRONIC PULSE AMPLIFIER CIRCUITS

[75] Inventor: William Emil Hess, Jr., Piscataway, N.J.

[73] Assignee: Bell Telephone Laboratories, Incorporated, Murray Hill, Berkeley Heights, N.J.

[22] Filed: Apr. 2, 1973

[21] Appl. No.: 347,067

[52] U.S. Cl. .................. 307/255, 307/270, 307/300, 307/313

[51] Int. Cl. .......................................... H03k 17/04

[58] Field of Search ... 307/239, 240, 213, 218, 268, 307/270, 280, 288, 255, 300, 303, 313, 230

[56] References Cited

UNITED STATES PATENTS

| | | | |
|---|---|---|---|
| 3,648,060 | 3/1972 | Hagen | 307/270 X |
| 2,961,551 | 11/1960 | Mattson | 307/269 |
| 2,963,592 | 12/1960 | Graaf | 307/300 X |
| 3,050,636 | 8/1962 | Sommerfield | 307/280 X |
| 3,470,391 | 9/1969 | Granger | 307/268 X |
| 3,641,368 | 2/1972 | Gamble et al. | 307/300 X |

FOREIGN PATENTS OR APPLICATIONS

| | | | |
|---|---|---|---|
| 756,707 | 4/1967 | Canada | 307/270 |

*Primary Examiner*—Rudolph V. Rolinec
*Assistant Examiner*—L. N. Anagnos
*Attorney, Agent, or Firm*—C. S. Phelan

[57] ABSTRACT

An improved electronic pulse amplifier circuit, which features three transistors of different conductivity types configured in cascade to provide high-speed, high-power operation, is disclosed. Rapid removal of excess stored minority carriers from the base region of a saturated middle transistor, and rapid charging of the natural interelectrode capacitances of the middle transistor and an output transistor are effected by a fourth "pull-down" transistor, the collector of which is connected to both the collector circuit of the middle transistor and to the base of the output transistor. Only a single bias voltage source is required; and the magnitude of the bias voltage, which determines the amplitude of the output pulses, may be varied over a wide range as a simple means of controlling the power gain of the circuit.

11 Claims, 2 Drawing Figures

ELECTRONIC PULSE AMPLIFIER CIRCUITS

BACKGROUND OF THE INVENTION

1. Field of the Invention

This invention relates, generally, to the field of electrical circuits and, more particularly, to the art of transistorized electronic pulse amplifier circuits.

2. Prior Art

Electronic pulse amplifiers are digital circuits that are designed to amplify or magnify sequences of binary electronic pulses which may be of varying durations or periods. Such pulses are used, for instance, in pulse-width-modulation (PWM) systems and in some single-wall magnetic domain apparatus. Inasmuch as the width of these pulses may contain encoded information, it is thus often a performance requirement that these pulse amplifiers be capable of amplifying and reshaping distorted pulses without changing either their duration or their periodicity.

Circuit designers normally configure these pulse amplifiers in cascaded transistor arrangements, with the number of amplification stages generally being determined by the amount of power amplification or gain that is desired. Unfortunately, however, the operating speed of a cascaded circuit is usually inversely proportional to the number of stages in the circuit. Therefore, as the number of stages and the power gain of the circuit increases, its operating speed usually decreases. Where high-speed operation is desired, it is consequently a common practice to decrease the number of stages and to increase the amount of amplification provided by each stage to the point where each of the stages operates over a wide range, such as, for example, from a saturated state to a cut-off state. This mode of operation has the effect of obtaining the same amount of power gain out of fewer amplification stages and advantageously increasing the operating speed of the circuit without sacrificing its power gain.

Unfortunately, however, as is often the case, the solution to one problem generates new, unforeseen problems. Two such problems which prevent the desired degree of increase in the operating speed of the circuit are: (1) the excess minority carriers that are stored in the base regions of transistors which are driven into saturation, and (2) the effect of "Miller capacitances" and other natural capacitances, i.e., distributed transistor interelectrode capacitances.

The minority carrier storage effect occurs when a transistor is driven into saturation and the collector-base junction becomes forward-biased. When this occurs, the collector emits minority carriers into the base region, causing an excess of minority carriers to be stored there. Since the transistor cannot be effectively turned-off while this stored base charge is present, a high level of collector-emitter current continues to flow after the forward base drive to the transistor is terminated. This collector-emitter current is maintained until all of the stored minority carriers are removed. The most common methods of removing the stored carriers are either to apply a reverse current to the base terminal of the transistor, or to include a parallel R-C combination in the base circuit of the transistor. The capacitor used in the latter technique is known in the art as a "speed-up" capacitor, the value of which is chosen in accordance with a well-known method that is described in connection with the minority-carrier storage effect in F. C. Fitchen, *Transistor Circuit Analysis and Design*, D. Van Nostrand: Princeton (Second Edition) 1966, at pp. 358–363.

Both of these techniques for removing excess stored carriers from the base regions of saturated transistors pose problems in pulse amplifier circuits, however, particularly where a saturated transistor constitutes an internal amplification stage. One problem of the first technique is that the application of a reverse current to the base terminal of a saturated transistor usually requires additional biasing circuitry in the nature of resistors and voltage sources of a different polarity than is otherwise required to bias the circuit. Another problem is that the reverse base current must either be switched out of the base circuit during the interval when the transistor is in a saturated state or be effectively countered during that time by a much larger forward base current drive than would otherwise be necessary.

The problems posed by the second technique are generally similar. For example, if a leakage path for discharge of the speed-up capacitor is not provided, the speed-up capacitor may, particularly when the input signal consists of a sequence of pulses having a high duty cycle , begin to accumulate charge . Eventually, when the capacitor becomes charged, it ceases to remove stored minority carriers from the base region of the transistor. It is, therefore, apparent that a simple improved method for removing stored minority carriers from the base regions of saturated transistors in pulse amplifier circuits is imperative.

As is pointed out above, the effects of the Miller and other interelectrode capacitances also create significant problems in the design of high-speed high-power electronic pulse amplifiers. Interelectrode capacitances are the natural and unavoidable capacitances that occur between the junctions or electrodes of nearly all transistors. The magnitude of these capacitances is usually proportional to the power capacity of the transistors. Consequently, the interelectrode capacitance problem is particularly acute in transistors in the output stages of pulse amplifiers and in power transistors in general.

The Miller capacitance is a significantly increased input capacitance which results from the natural unavoidable interelectrode capacitance that mutually links the input and output terminals of a transistor amplifier stage. For instance, in a common-emitter, transistor configuration, the natural interelectrode capacitance between the base and collector of the transistor is effectively magnified by a factor equal to the transconductance of the transistor. This effect is explained in more detail in F. C. Fitchen, supra, at pp. 19–21, 138–140.

The primary effect of the Miller and other interelectrode capacitances in a transistorized pulse amplifier circuit is to decrease the operating speed of the circuit, particularly where the transistors in the circuit are large power transistors that operate over signal ranges taking the transistors from saturated states to cut-off states. For example, in a common-emitter transistor amplifier stage, each time the transistor swings from a cut-off state to a saturated state, its Miller capacitance must be completely discharged from the collector-base voltage to which it is charged during cut-off; and each time the transistor swings from a saturated state to a cut-off state, its Miller capacitance must be recharged to the same cut-off voltage.

Due to a combination of the large Miller and other interelectrode capacitance values and the large collector-bias voltages which are commonly found in pulse amplifier circuits, the charging and discharging of these capacitances must be effected through relatively high current paths if the circuits are to operate at high speeds. Unfortunately, however, prior art pulse amplifiers have failed to include such paths within their normal biasing circuitry; and it is expensive to provide additional base drive circuitry the sole function of which is to provide high current paths to reduce the effects of the interelectrode capacitances.

It is, therefore, an object of the present invention to provide an improved high-speed high-power electronic pulse amplifier circuit that is configured to rapidly remove excess stored minority carriers from the base region of its saturated transistors.

It is another object of this invention to provide a pulse amplifier circuit in which the Miller and other interelectrode capacitances of each transistor that operates over a large voltage range are included in high current charging and discharging paths.

It is yet another object of this invention to provide the aforementioned features without the necessity of including additional bias voltage sources and to reduce the bias hardware requirements in the turn-off circuitry of the pulse amplifier.

SUMMARY OF THE INVENTION

The invention lies in an improved pulse amplifier circuit which features a plurality of cascaded transistors of different conductivity types that are configured to provide high-speed high-power amplification of a sequence of electronic pulses while maintaining the duration and periodicity of the pulses. Rapid removal of excess stored minority carriers from a saturated one of the cascaded transistors, and rapid charging and discharging of the interelectrode capacitances of the saturated transistor and an emitter-follower output transistor are effected when the circuit is turned-off by a "pull-down" transistor, the collector of which is connected both to the collector of the saturated transistor and to the base of the output transistor.

DETAILED DESCRIPTION OF THE INVENTION

Figure 1:
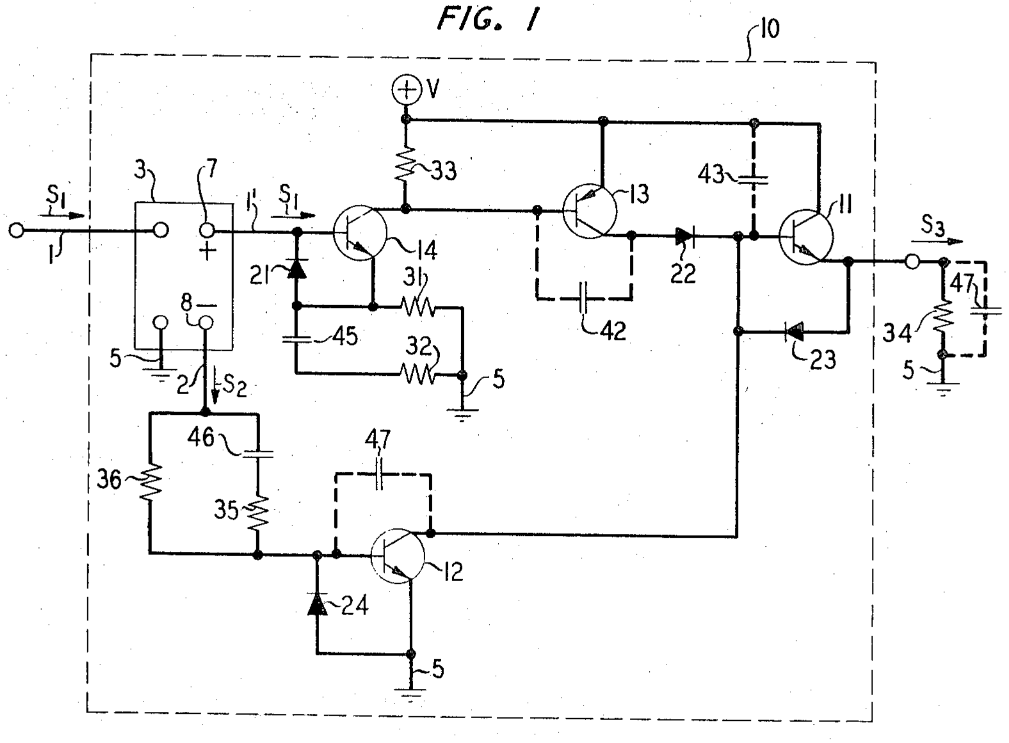
FIG. 1 depicts a schematic diagram of the pulse amplifier circuit in which the invention is embodied.

Referring to FIG. 1, pulse amplifier circuit 10 in which the invention is embodied comprises four transistors: 11, 12 and 14, which are of one conductivity type (NPN), and 13, which is of the opposite conductivity type (PNP). Inasmuch as no quiescent forward base current drive is provided to any of the transistors, they are all biased in normally OFF (nonconducting) states.

When a binary input voltage signal $S_1$ is coupled on lead 1 into control circuit 3, binary inverse $S_2$ of the signal is produced in control circuit 3 and is coupled onto lead 2. Control circuit 3 comprises a well-known type of inverting amplifier with a noninverting output 7 and an inverting output 8. $S_2$ is either a negative pulse or a null signal (no pulse) while $S_1$ is a positive pulse; and $S_2$ is a positive pulse when $S_1$ is either a negative pulse of a null signal. For the purpose of illustration herein $S_2$ will be shown as either a positive pulse or a null signal, and, correspondingly, $S_1$ will be shown as either a null signal or a positive pulse. In practical applications, $S_2$ is advantageously delayed slightly in any well-known manner in control circuit 3 to allow the effects of $S_1$ and $S_2$ to reach the base of transistor 11 at essentially the same time. However, this delay is not essential to the operation of the invention and, consequently, is not depicted in FIG. 2, which, among other things, illustrates the temporal relationship between $S_1$ and $S_2$.

Input signal $S_1$ is coupled through control circuit 3 and noninverting output 7 onto lead 1', which connects to the base of transistor 14. Transistor 14 is switched into a conductive state by $S_1$ whenever $S_1$ is in a positive state. A well-known "overdrive" circuit configuration, comprising resistors 31 and 32 and capacitor 45, is connected between the emitter of transistor 14 and circuit ground 5. The overdrive circuit, which presents a relatively low impedance to high-frequency signals and a relatively high impedance to low-frequency signals, causes an initial burst of collector-emitter current to flow in transistor 14 when the transistor is first turned-on. This initial burst of collector-emitter current in transistor 14 provides a sufficiently large forward base current drive to transistor 13 to drive transistor 13 into saturation.

The values of resistors 31 and 32 and capacitor 45 in the overdrive circuit are related to the bandwidth of the input signal $S_1$. A sample calculation for the values of the elements comprising such an overdrive circuit as a function of the bandwidth of the input signal is shown in F. C. Fitchen, *supra*, pp. 256–259.

After this large initial burst of current in transistor 14, a smaller, steady-state, collector-emitter current begins to flow. The magnitude of this current is determined by the magnitude of resistor 31 and is sufficient to maintain transistor 13 in a saturated state. The electrical signal path comprising resistor 33 and bias voltage source V serves as a leakage path that prevents the reverse bias, collector-base, leakage current of transistor 14 from turning transistor 13 ON while $S_1$ is a null signal and as a bias circuit for transistor 14.

Diode 21 is connected in a well-known manner between the emitter and base of transistor 14 in a direction to protect the base-emitter junction of the transistor against excessive reverse biasing and to prevent charge from accumulating on capacitor 45 when $S_1$ is a null signal and the transistor is in an OFF state. It is, thus, necessary that lead 1' and noninverting output 7 of control circuit 3 remain at the potential of ground 5 when $S_1$ is a null signal.

The large collector-emitter current that ensues in transistor 13 following the turn-on of transistor 14 in turn quickly drives transistor 11 into conduction. Transistor 11 is not driven into saturation, however, as diode 22, the anode of which is connected to the collector of transistor 13 and the cathode of which is connected to the base of transistor 11, ensures that the collector-base junction of transistor 11 remains reverse-biased, thereby preventing transistor 11 from being driven into saturation. The binary inverse, $S_2$, of input signal $S_1$ keeps transistor 12 in a nonconducting state while $S_1$ is in a positive state. Consequently, transistor 12 is of no effect here; and the voltage at the emitter of transistor 11 is abruptly switched from ground level to a level of approximately (V−1) volts, thereby generating an output voltage signal $S_3$ that is an amplified replica of input signal $S_1$.

Output signal $S_3$ remains at this high level during the entire positive occurrence of input signal $S_1$. When the input signal $S_1$ terminates, i.e., becomes a null signal, $S_2$ becomes a positive signal. This positive signal is coupled to the base of transistor 12 through the well-known overdrive circuit configuration comprised of resistors 35 and 36 and capacitor 46. Transistor 12 is abruptly driven into saturation. Diode 24, which is connected between the emitter and base of transistor 12, is similar in function to diode 21, i.e., it serves to prevent charge from accumulating upon capacitor 46 when $S_2$ is a null signal and protects the base-emitter junction of transistor 12 against excessive reverse biasing. It is, thus, also a requirement that lead 2 and inverting output 8 of control circuit 3 remain at the potential of ground 5 when $S_2$ is a null signal.

In the meantime, the termination of the positive portion of $S_1$ has the effect of turning-off transistor 14. In response, transistor 13 is, for two reasons, quickly driven to an OFF state in the shortest of possible times. First, the base current drive to transistor 13 is cut off by the nonconductance of transistor 14. Second, the collector-emitter current generated in transistor 12 serves to rapidly remove through the collector of transistor 13 and diode 22 excess minority carriers that are stored in the base region of transistor 13.

The collector-emitter current of transistor 12 also serves (1) to cut off the forward base current drive to transistor 11, thereby turning transistor 11 OFF, (2) to charge interelectrode capacitance 43 between the collector and base of output transistor 11 to its OFF-state voltage of approximately V volts, and (3) to charge Miller capacitance 42 of transistor 13 to its OFF-state voltage. The collector-emitter current of transistor 12 also serves to "pull-down" the circuit load to the potential of ground 5 through diodes 23, which is forward-biased only when transistor 12 is in an ON state. The circuit load is schematically depicted in FIG. 1 as a parallel combination of a load resistor 34 and an output capacitance 47.

As will be recalled from the foregoing definition of a Miller capacitance, the value of Miller capacitance 42 is approximately the value of the natural base-collector capacitance of transistor 13 multiplied by the transconductance of transistor 13. Capacitance 43 is not a Miller capacitance because it does not mutually couple the input and output terminals of transistor 11, which are, respectively, the base and emitter terminals of transistor 11. But, since transistor 11 is usually a power transistor which has inherently large interelectrode capacitances, capacitance 43 is usually of significant magnitude. The collector-emitter current of transistor 12 need, therefore, be of a magnitude to charge capacitances 42 and 43 and discharge capacitance 47 within the desired fall time for output signal $S_3$. In practice, the collector-emitter current of transistor 12 is usually about three times larger than the collector-emitter current of transistor 13. Advantageously, the collector-emitter current in transistor 12 presents no significant power dissipation problem, since transistor 12 is immediately choked off after capacitances 42 and 43 are charged, capacitance 47 is discharged, and the base of transistor 11 is lowered to near the potential of ground 5.

Figure 2:
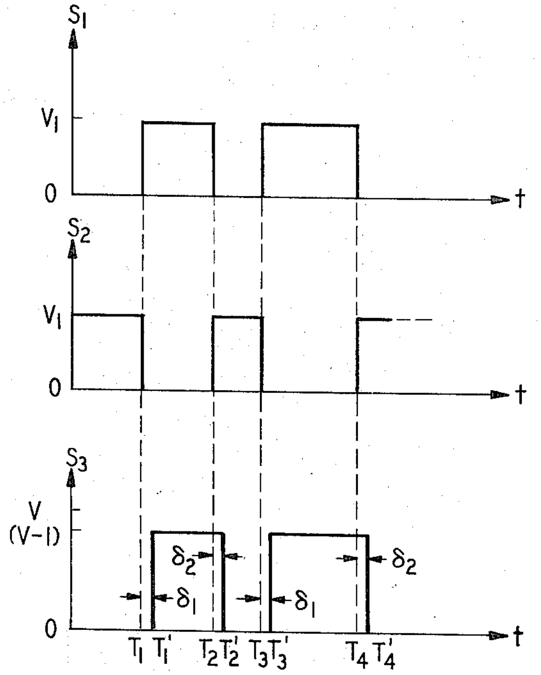
FIG. 2 shows a sequence of input and output pulses which illustrate the operation of the circuit depicted in FIG. 1.

A plot of the temporal relationship between signals $S_1$, $S_2$ and $S_3$ is depicted in FIG. 2. Amplitude $V_1$ of $S_1$ and $S_2$ need only be large enough to drive transistors 12 and 14 into normal conduction and saturation, respectively. Delay interval $\delta_1((T_1'-T_1)$ and $(T_3'-T_3))$ represents the turn-on time of circuit 10 and is determined by the rise times of the signals produced by the transistors 11, 13 and 14 and, in some cases, the fall time of the signal produced by transistor 12. Delay interval $\delta_2((T_2'-T_2)$ and $(T_4'-T_4))$ represents the turn-off time of circuit 10 and is determined by the fall times of the signals produced by transistors 11, 13 and 14 and the rise time of the signal produced by transistor 12. As is apparent from FIG. 2, the amplitude of $S_3$ is (V−1) volts and is, therefore, proportional to the magnitude of bias voltage V.

Several significant advantages are achieved by using the base of transistor 11 as the "pull-down point" of the circuit. The pull-down point in a transistor circuit is a key circuit node, usually located between the output of a circuit and its load, which is quickly lowered to ground or some other predetermined potential, by a transistor switch for the purpose of increasing the turn-off speed of the circuit.

One advantage of the location of the pull-down point in the present invention is that all of the stored excess minority carriers in transistor 13 are removed before they are amplified in transistor 11. As a result, the stored carriers are removed in a faster time than would otherwise be possible if the carriers were removed at the emitter of transistor 11 after they had been amplified by transistor 11. This feature is due to the fact that the time required to remove the excess stored minority carriers at the emitter of transistor 11 would be increased by the factor $\beta$, the forward current gain of the transistor, if the pull-down point of the circuit were connected to the emitter rather than the base of the transistor. This analysis assumes, of course, that the pull-down current produced by transistor 12 remains constant for the two possible configurations. A further decrease in the time required to remove the stored excess carriers in transistor 13 may also be achieved by increasing the magnitude of the pull-down current.

Another advantage of this location for the circuit pull-down point is that the collector-emitter current of transistor 12 is used to directly charge both Miller capacitance 42 of transistor 13 and collector-base interelectrode capacitance 43 of transistor 11, thereby decreasing the turn-off times of transistors 11 and 13 and the fall time of output signal $S_3$. If capacitances 42 and 43 were charged through the emitter of transistor 11, the charging current for the capacitors would need to be $\beta$ times greater than is required in the present invention.

The interelectrode capacitances of transistor 14 do not appreciably slow down the operation of the circuit, since transistor 14 operates over a relatively low collector-emitter voltage range; transistor 14 does not go into saturation; and unlike transistor 11, transistor 14 is neither an output transistor nor a power transistor. The interelectrode capacitances of transistor 12 also do not appreciably affect the operating speed of the circuit, since the terminals of transistor 12 are all located in relatively high current paths. For example, Miller capacitance 47 between the base and collector of transistor 12 is quickly discharged by the large collector-emitter current of transistor 12, which ensures that capacitances 42 and 43 are charged and capacitance 47 discharged as circuit 10 is being turned-off. The base-emitter capacitance of transistor 12 is effectively offset by capacitor 46 in the well-known manner described in F. C. Fitchen, supra, at pp. 358–363.

Yet another advantage of the circuit is that the circuit is configured so that the amplitude of output signal $S_3$ trails the magnitude of the bias voltage V. Since transistor 14 is essentially a constant current generator, bias voltage V can, therefore, be varied over a wide range without affecting the biasing or performance of the circuit. As a result, the amplitude of output signal $S_3$ is variable over a wide range through simple adjustment of the magnitude of bias voltage V.

Although the present invention has been described in connection with particular applications and embodiments thereof, it is intended that all modifications, applications and embodiments which will be apparent to those skilled in the art in light of the teachings of the invention be included within the spirit and scope of the invention.

What is claimed is:

1. A pulse amplifier comprising first and second means for amplifying pulses, each of said amplifying means having predetermined distributed capacitances associated therewith, means for interconnecting said first and second amplifying means to a common terminal for receiving operating energy, said first and second amplifying means being biased in normally nonconducting states, means for interconnecting said first and second amplifying means to a common energy return terminal, means for coupling an output of said first amplifying means to an input of said second amplifying means, means for applying to an input of said first amplifying means a pulse, said first and second amplifying means tandemly amplifying such pulse, and means, connected between said coupling means and said common return terminal, for drawing a current from said coupling means to charge said distributed capacitances in response to the termination of such pulse.

2. An electronic pulse, amplifier circuit, comprising first and second transistors of a first conductivity type and a third transistor of a second conductivity type, the collector of said third transistor connecting through a first electrical signal path to the base of said first transistor and the collector of said second transistor connecting through a second electrical signal path to the base of said first transistor, said first and third transistors having distributed collector-base capacitances; and means for applying to the base of said third transistor a first binary pulse of appropriate polarity and amplitude to drive said first transistor into a conducting state and said third transistor into a saturated conducting state, and for terminating said first pulse and applying to the base of said second transistor a second pulse of appropriate polarity and amplitude to drive said second transistor into a conducting state, thereby removing stored minority carriers from the base region of said third transistor and charging the distributed capacitances of said first and third transistors.

3. The circuit in accordance with claim 2 in which said applying means includes a fourth transistor of said first conductivity type, the collector of which is connected to the base of said third transistor and to the base of which is applied said first pulse, said first pulse driving said fourth transistor into a conducting state and the termination of said first pulse driving said fourth transistor into a nonconducting state.

4. The circuit in accordance with claim 3, further comprising means for applying a single voltage of appropriate magnitude and polarity to bias said first, second, third and fourth transistors in normally nonconducting states.

5. The circuit in accordance with claim 4 in which the means for applying a bias voltage further includes:

means for applying said voltage through a third electrical signal path to the emitter of said third transistor;

means for applying said voltage through a fourth electrical signal path to the collector of said fourth transistor; and means for applying said voltage through a fifth electrical signal path to the collector of said first transistor.

6. The circuit in accordance with claim 5 in which said first electrical signal path includes a diode poled in the same direction as the base-emitter junction of said first transistor, thereby allowing forward current to flow from the collector of said third transistor to the base of said first transistor.

7. The circuit in accordance with claim 6, further comprising a diode connecting between the emitter and base of said first transistor, such diode being oppositely poled with respect to the base-emitter junction of said first transistor.

8. The circuit in accordance with claim 7 in which an overdrive circuit is included in the emitter circuitry of said fourth transistor and a biasing resistor is included in said fourth electrical signal path.

9. The circuit in accordance with claim 3 in which said applying means includes means for concurrently providing the binary inverse of a binary input pulse, whereby such binary inverse is said second pulse and such input pulse is said first pulse.

10. The circuit in accordance with claim 9 in which said providing means includes a seventh electrical signal path for coupling said first pulse to the base of said third transistor and a sixth electrical signal path for coupling said second pulse to the base of said second transistor.

11. The circuit in accordance with claim 10 in which said sixth signal path includes an overdrive circuit for decreasing the turn-on and turn-off times of said second transistor.

* * * * *